United States Patent [19]

Belser et al.

[11] 4,074,254

[45] Feb. 14, 1978

[54] XY ADDRESSABLE AND UPDATEABLE COMPRESSED VIDEO REFRESH BUFFER FOR DIGITAL TV DISPLAY

[75] Inventors: Karl Arnold Belser, Campbell; Philip Bradshaw Metz, Saratoga, both of Calif.

[73] Assignee: International Business Machines Corporation, Armonk, N.Y.

[21] Appl. No.: 707,803

[22] Filed: July 22, 1976

[51] Int. Cl.$^2$ ............................................. G06F 3/14
[52] U.S. Cl. ............................. 340/324 AD; 178/30; 364/900
[58] Field of Search ........ 340/324 AD, 324 A, 172.5; 178/30

[56] References Cited

U.S. PATENT DOCUMENTS

| | | | |
|---|---|---|---|
| 3,444,319 | 5/1969 | Artzt et al. | 340/324 AD |
| 3,480,943 | 11/1969 | Manber | 340/324 AD |
| 3,973,245 | 8/1976 | Belser | 340/324 AD |
| 3,974,493 | 8/1976 | de Cavaignac | 340/324 AD |
| 3,976,831 | 8/1976 | Danell et al. | 340/324 AD |

*Primary Examiner*—Marshall M. Curtis
*Attorney, Agent, or Firm*—Otto Schmid, Jr.

[57] ABSTRACT

A compressed refresh buffer utilizing a random access memory is disclosed which performs a mapping between the refresh buffer and a video display screen, such that only non-zero screen areas are represented in the refresh buffer. The dot image on the video screen is divided into rectangular subarrays. If the subarray has image points plotted in it, it is designated active and the bits of each active subarray are stored in the refresh buffer. If no image points are plotted in a subarray, it is designated inactive. A row bit map is provided which includes one bit for each subarray in the row with a "one" bit representing an active subarray and a "zero" bit representing an inactive subarray. Control means including a row tag pointer memory is provided for storing a linked list of pointers associated with each active subarray in a row, each pointer pointing to the location in the random access memory of an active subarray. This control means permits dynamically updating of the information in the buffer as the image is changed and updating of the map to reflect the current status of stored subarrays. Subarrays can thus be entered or deleted from the map as their active/inactive status changes.

4 Claims, 3 Drawing Figures

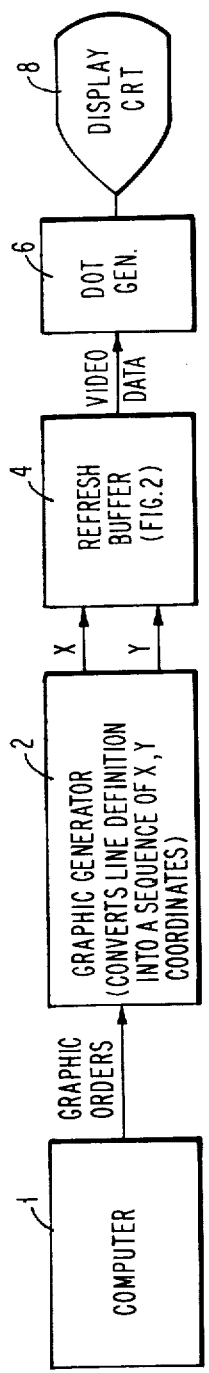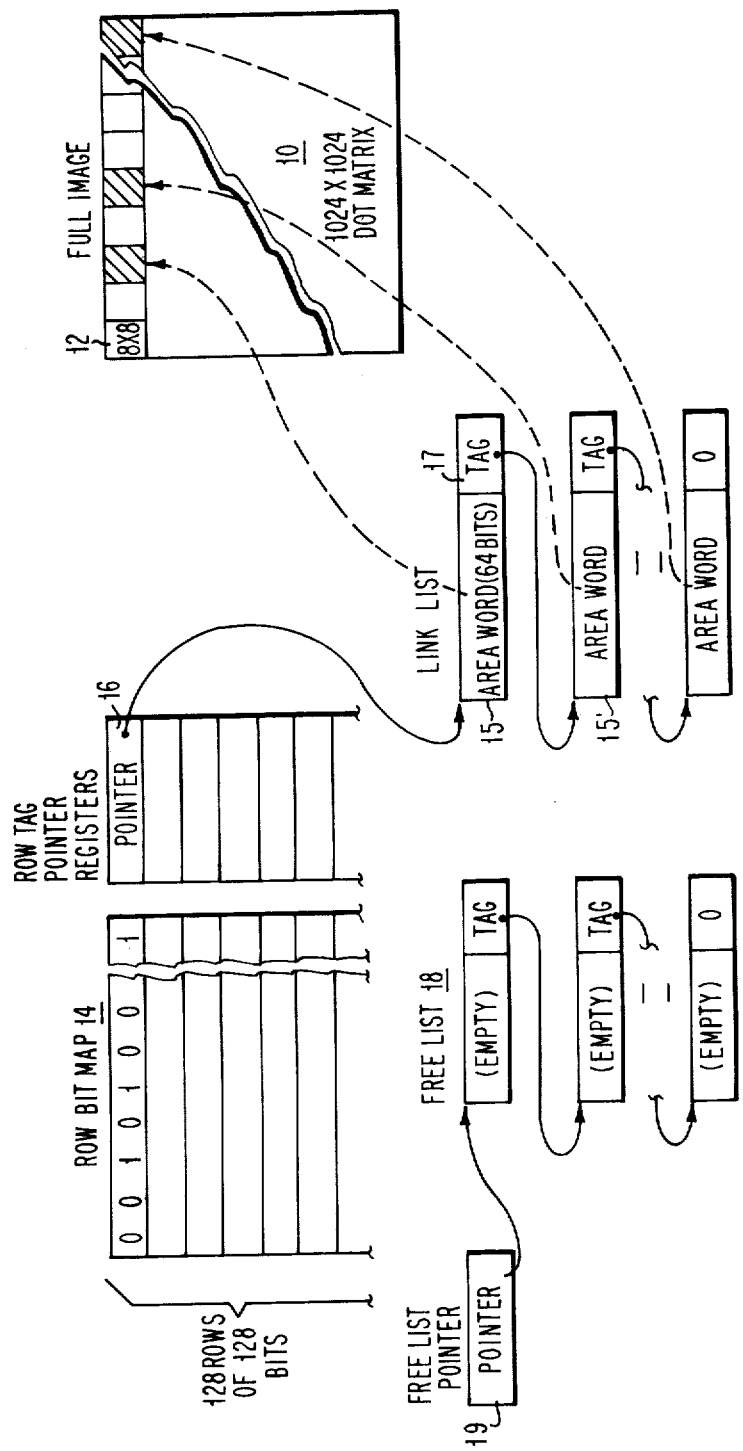

XY ADDRESSABLE AND UPDATEABLE COMPRESSED VIDEO REFRESH BUFFER FOR DIGITAL TV DISPLAY

BACKGROUND OF THE INVENTION

1. Field of the Invention

The invention relates to memory systems and more particularly to memory systems in which dot matrix pictorial information is stored and accessed periodically to supply data to a raster device.

In graphical display systems, graphic orders which are encoded in the form of lines drawn between XY coordinate pairs are converted into a visual image and displayed on a cathode ray tube type of display. The graphical data is presented in a matrix of dots that are modulated onto the video raster of the cathode ray tube. The present invention is concerned with the type of system in which each dot on the display is refreshed by a refresh memory with one memory bit corresponding to each dot on the display. Hence, in prior display systems of this type, a raster containing 1,024 × 1,024 dots required a memory to hold the picture information which would be approximately one million bits in size. This type of memory is referred to as a full bit map memory, since there is one bit for each dot on the display screen.

The encoded graphical data to be displayed on the screen must be converted into points which are plotted into the full bit map memory. Since the graphical data consists of line segments which may start and end at any point on the screen, it is necessary that the full bit map memory be a random access memory so that points are plotted at the maximum possible data rate.

A major drawback of the full bit map memory approach is the high cost of the refresh memory. It is therefore commercially advantageous to reduce the cost of the full bit memory.

Since there are large open spaces in line-drawn images, the open spaces can be compressed by using fewer bits per picture element by data compression techniques. In the case of refresh memories in graphic systems, the technique chosen must be such that the compressed data is easily changeable so that points may be added or deleted from the screen without having to regenerate the whole image each time a change is desired.

It is therefore a paramount object of this invention to provide a compressed refresh memory which is smaller and less expensive than a bit-per-picture element memory for the equivalent function. The only exception to this would be when the compression factor for the compressed memory is exceeded. However, one can always guarantee to attain a certain compression factor by magnifying the image to be presented on the screen. A magnification by a factor of two, for example, multiplies the open space area by four, thus greatly increasing the possible compression factor.

It is a further object of this invention to enable points to be added or deleted from the compressed memory representation of the image without having to rewrite the entire memory contents.

A further object of the invention is to provide a random access memory facility with the compressed memory so that point plotting and deleting is done at a speed which is substantially higher than a serial access memory.

It is an object of this invention to provide a compressed refresh memory which has the same functional characteristics as a full bit memory.

It is another object of this invention to provide a compressed refresh memory which can be accessed in a row major format to supply data to a raster device.

SUMMARY OF THE INVENTION

Briefly, the above objects are accomplished in accordance with the invention by providing a refresh memory system in which the full image dot matrix to be displayed is divided into a plurality of subarrays. Control means are provided for designating each subarray which has at least one dot of a given value in it "active." The control means stores each such active subarray in a refresh buffer. A map is maintained of each active subarray in a refresh buffer. A map is maintained of each active subarray to correlate the subarrays to their relative position in the full image dot matrix. The control means dynamically updates the contents of the refresh buffer and the map as the full image changes with respect to time. By this means the subarrays are entered into and deleted from the refresh buffer and corresponding changes are made to the map as the active/inactive status of the subarray changes.

The invention has the advantage that it reduces the cost of storage since empty cells not containing active image dots are not stored.

The invention has the further advantage that by utilizing a random access addressing mechanism, the invention enables the compression to be made transparent because the random access storage can be addressed the same as a standard random access store.

BRIEF DESCRIPTION OF THE DRAWINGS

The foregoing and other objects, features and advantages of the invention will be apparent from the following detailed description of a preferred embodiment of the invention as illustrated in the accompanying drawings.

FIG. 1 is an overall block diagram of a graphics display system in which the invention is embodied;

FIG. 2 is a block diagram of the dataflow of an XY addressable compressed video refresh buffer shown in FIG. 1.

DETAILED DESCRIPTION OF THE PREFERRED EMBODIMENT

Figure 3:
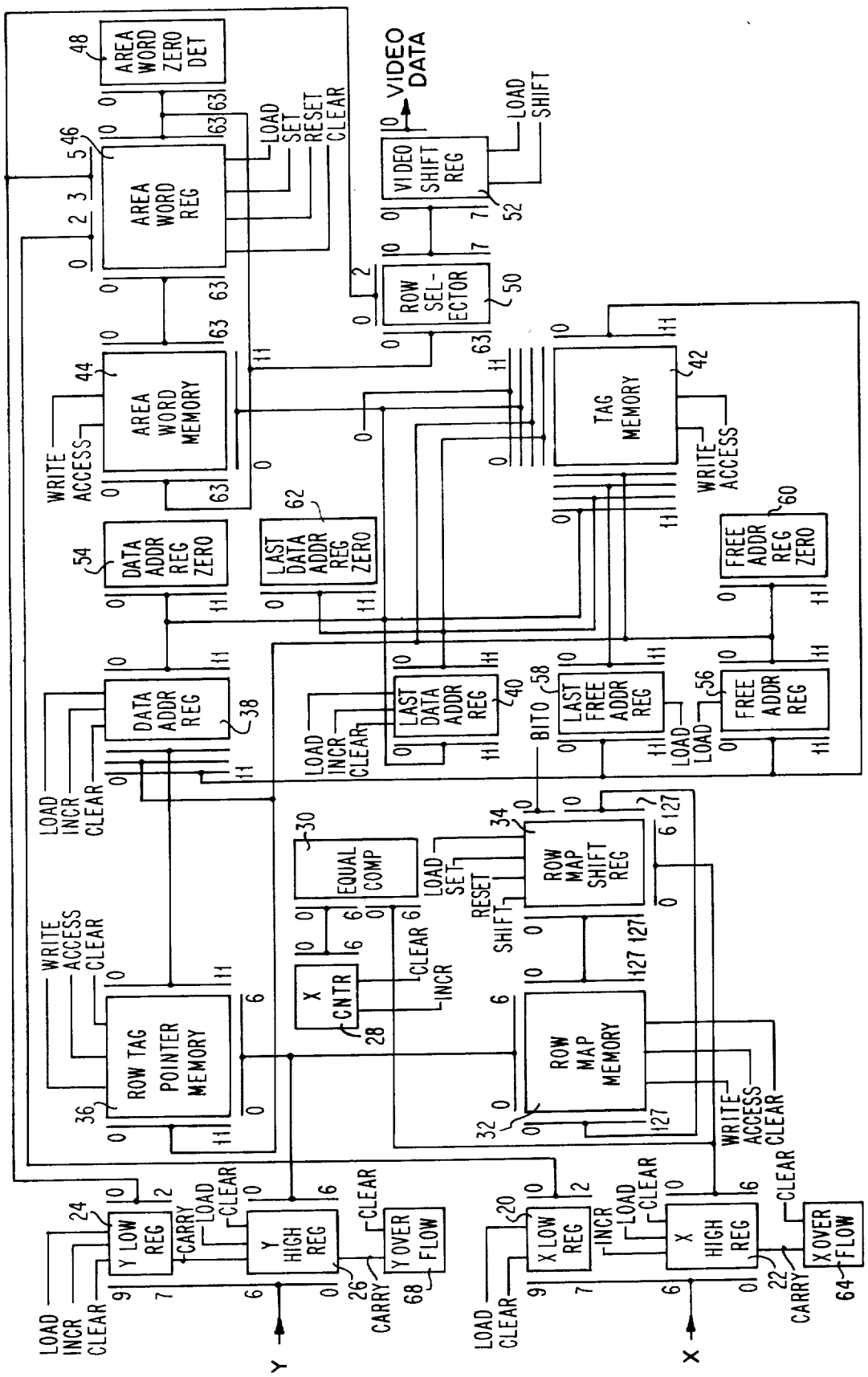
FIG. 3 shows a block diagram and data flow for a preferred embodiment of the invention.

U.S. patent application Ser. No. 477,717, filed June 10, 1974 entitled "Method and Apparatus for Point Plotting of Graphical Data from a Coded Source into a Buffer and for Rearranging that Data for Supply to a Raster Responsive Device", to Karl Belser, now U.S. Pat. No. 3,973,245 discloses a computer controlled graphics display apparatus of the type in which the refresh buffer of the present invention could be embodied. A diagram of such a graphic display system is shown in FIG. 1. A computer 1 issues encoded graphic orders to a graphics generator 2. The generator 2 converts these orders, which contain line definitions, into a sequence of X,Y coordinates. The X,Y coordinates are translated by refresh buffer 4 into serial video data. The serial video data is converted to cathode ray tube (CRT) format by dot generator 6 for display on CRT 8.

This invention may be implemented for many different dot matrix array sizes on the CRT screen as well as many different memory word widths. It is assumed for purposes of illustration that the dot matrix size of the display is 1024 × 1024 dots. The memory word width is assumed to be 64 bits wide.

Referring to FIG. 2, the 1024 × 1024 dot matrix 10 which comprises the display is divided into subarrays 12, each of which is, for example, 8 × 8 dots square. In terms of the subarrays, the dot matrix then is made up of an array of 128 subarray rows with 128 subarrays in each row. The open space in line drawn images is quantified in terms of these 8 × 8 dot subarrays. If a subarray has points plotted in it, then it is called active. If it has no points plotted in it, then it is called inactive or free. Only active subarrays have bits in the compressed memory. The free subarrays on the display are backed by a compression code.

The compression encoding is done by associating with each subarray a single bit in what is called a row bit map 14. In this embodiment, there are 16,384 bits in the map corresponding to the array of 128 × 128 subarrays. If the bit in the map corresponding to a particular subarray is zero, then that subarray is free. If the bit in the memory is one, then there is a 64 bit area word 15 in the compressed buffer, which corresponds to the 8 × 8 dot matrix of the subarray.

In order to give the compressed refresh buffer 4 the characteristics of point plotting and deleting in a random manner, the memory is organized as a list and addressed using standard list processing or tag sorting techniques. It is assumed that the display Cathode Ray Tube (CRT) 8 is refreshed in a raster format proceeding from left to right and then top to bottom of the screen. To facilitate this refresh method, the subarrays are organized in rows first and then columns within each row. In accordance with the invention, the memory controls access data to the nearest row, and then serially access the particular subarray within the row using list processing techniques.

There are 128 rows of subarrays in the embodiment shown. Each row has associated with it a row tag pointer register 16 which points to the head of a linked list of the area words which are contained in that row. The linking is done by associating with each area word 15 a tag pointer 17, which points to the next area word in succession. The last area word contained in a particular row has a tag of zero. A zero tag is always interpreted as an end of a string of tags. The tag is actually the physical address of the area word in the compressed memory. The area word for a particular subarray may be stored in any location in the memory.

Also associated with each row of subarrays is a place holder map called a row bit map 14 which has one bit in it for each subarray in the row. The left most bit corresponds to the left most subarray 12 for that row of the full image 10. The right most bit corresponds to the right most subarray for that row. A zero place holder bit indicates that there is no area word in the compressed refreshed memory for that subarray. A one bit indicates that there is an area word in memory.

The 128 bit map spreads the linked area words for that row out over the row of subarrays; that is, when the first one bit from the left of the place holder map is encountered the area word 15 whose address 16 is in the row tag pointer register for that row is the data corresponding to that position. The second one bit from the left in the bit map 14 corresponds to the next area word 15' whose address is contained in tag 17 that the first area word 15 has associated with it. This chaining process continues throughout the row of subarrays to spread the area words out across that row. This process of threading through the area word list using the place holder map is called unraveling the list.

In summary, accessing any particular subarray on the screen is a two step process. The first step is a random access of the row tag pointer register and the row bit map corresponding to the particular subarray row. The second step is the horizontal search which involves unraveling the list for that row.

Video data is generated from the compressed video refreshed buffer by acccessing the subarray rows one at a time from top to bottom of the screen, and for each row serializing the subarray information in single line format. In this case there are eight raster lines generated from each subarray row. To generate one raster line of data, the list for that row is unraveled systematically from left to right during the refresh of the CRT. For row bit positions having a zero bit, eight zeros are sent to the display device. For place holder positions having a one bit, the corresponding area word is unraveled from the linked list and accessed from the compressed buffer. Only one of the eight one-line (8-bit) rows in the subarray is sent to the display device depending on which raster line is being generated. The linked list has to be unraveled eight times for that subarray row in order to generate the eight raster lines. This process continues from the top to the bottom of the screen.

The second function of the compressed memory is the addition and deletion of points. There is no problem in adding new points or deleting points from a subarray that already has an area word in the compressed memory. The problems occur when the point is the first point to be plotted in a previously free subarray, or it is the last point to be deleted from a previously active subarray. These three cases are now considered.

CASE 1 - Plot Point in Active Subarray

A point specified by an X and a Y coordinate is to be plotted in a currently active subarray. The steps are as follows for 8 × 8 subarrays. The low order 3 bits of X and the low order 3 bits of Y are used to address the horizontal and vertical positions, respectively, within the subarray. The high order 7 bits of Y are used to randomly address the row information of the subarray, specifically the row bit map and the area word list pointer for that row. The high order 7 bits of X are used to determine how far the area word list for that row should be unraveled in order to find the addressed area word. Once the address of the addressed area word has been obtained, the area word data for that address is accessed from the compressed refresh memory. The new point is plotted or the old point is deleted from the area word. Then that area word is restored in that address location.

CASE 2 - Plot Point In Inactive Subarray

If the point to be plotted lies in a free (inactive) subarray, then it is necessary to link in a new area word from free list 18 into the link list for that subarray row, plot the point in that area word location, and store that word in the compressed refresh buffer. The same steps are followed as in the case of plotting the point into an active subarray up to the point where the address of the area word in which the point is to be plotted is obtained. There is no address for that location in the link list since the subarray is free. Instead, addresses of the area words which lie to the left of and to the right of the place where the new area word must be inserted are obtained. The area word insertion steps in terms of left and right addresses are as follows. Take the address of the area word to the right of the subarray in which the point is to be plotted, and make that the tag associated with the new area word. Take the address of the new area word and make that the tag associated with the area word to the left of the subarray in which the point is to be plotted. This links the new area word into the list for that row. It is also necessary to set a bit in the map 14 that corresponds to this area word position. From then on the plotting operation is the same as before.

CASE 3 - Deleted Point Makes Subarray Inactive

If a point to be deleted is the only point left in that particular subarray, the subarray becomes inactive or free. It is desirable to delink the area word corresponding to that subarray in order to make the memory space available for the plotting of other points at other positions on the screen. The delinking steps are as follows. Take the address of the area word, which is to the right of the subarray in which the point has been deleted and make that address the tag of the area word on the left of the subarray. This effectively skips over the area word which is now free. Also, the bit in the row bit map corresponding to the now free subarray must be reset to zero.

Free List Management

In order to keep track of the unused words in the compressed buffer, it is necessary to maintain a free list, which is just like one of the lists for a subarray row, except that it does not correspond to a subarray row. The free list has a register 19 associated with it that points to the head of the list. A new area word is added to the link list from the free list 18 in the following manner. The free list pointer 19 points to the address of the first empty area word on the free list 18. This address is placed in the tag position of the area word to the left of where an area word is to be inserted in the link list. The tag of the first empty word in the free list 18 replaces the pointer register contents 19 so that the pointer now points to the empty area word which is now at the top of the free list 18. The address of the area word in the link list to the right of the newly added area word becomes the tag of the newly added word. The corresponding bit for this newly added area word in the row bit map 14 of the newly added area word is set to one to complete the addition to the link list.

Area words from the link list which become empty or free are added to the free list 18 in the following manner. The address of the area word to the right of the area word which has become free is inserted in the tag position of the area word to the left of the new free subarray. The contents of the pointer register 19 are inserted into the tag position of the newly free area word so that it points to the previous top of the free list chain. The contents of the pointer register are replaced by the address of the newly free area word. Thus, the newly free area word becomes the top of the free list chain. The last entry in the free list has the unique tag of zero so that it is possible to detect when the free list is empty. The compression factor for the compressed refresh buffer has been exceeded when the free list is empty.

The notation used in the block diagram of FIG. 3 is as follows.

Data paths are shown entering and leaving the vertical sides of the blocks, and control paths and address paths enter the tops and buttons of the blocks. Specifically, data enters the block on the left and leaves the block on the right.

DESCRIPTION OF THE COMPONENTS OF THE FIGURE

XLR-X Low Register 20 is a 3 bit register which stores the low order bits of the X coordinate.

XHR-X High Register 22 is a 7 bit register which stores the high order bits of the X coordinate. It is also a counter whose carry increments X Overflow 64.

XLR-Y Low Register 24 is a 3 bit register which stores the low order bits of the Y coordinate. It is also a counter whose carry increments Y High Register 26.

YHR-Y High Register 26 is a 7 bit register which stores the high order bits of the Y coordinate. It is also a counter whose carry increments Y Overflow 68.

XC-X Counter 28 is an up counter used to count the serial access steps along a subarray row.

EC-Equal Comparator 30 is an exclusive OR circuit used to detect when the contents of X Counter 28 equals the contents of X High Register 22.

RMM-Row Map Memory 32 is a 128 word by 128 bit per word memory. Each word is a map of the corresponding subarray row.

RMSR-Row Map Shift Register 34 is a 128 bit shift register used in the serial accessing of data along a subarray row. In addition, the register is bit addressable so that individual bits may be changed in the map.

RTPM-Row Tag Pointer Memory 36 is a 128 word by 12 bit per word memory containing a pointer to the first tag of the list in Tag Memory for that row. A zero word means that there is no list for that row.

DAR-Data Address Register 38 is a 12 bit register used to address both the Area Word Memory 44 and the Tab Memory 42. It is also a counter used in the initiliazation sequence of Tag Memory 42.

LDAR-Last Data Address Register 40 is a 12 bit register used to save the previous tag in the linked list for a subarray row. It is also a counter used in the initialization sequence of Tag Memory.

TM-Tag Memory 42 is a 4096 word by 12 bit per word memory used to store the link tag lists for each subarray row, as well as the list for the linked free list. The contents of address zero in this memory is a pointer to the first unused word in the free list.

AWM-Area Word Memory 44 is a 4096 word by 64 bit per word memory which is used to store picture element information for selected 8 × 8 subarrays on the screen. The word with address zero is not used in this inplementation.

AWR-Area Word Register 46 is a 64 bit register which is sued for accessing area word data for the purposes of refreshing the display on the screen, or for changing the information content of the picture. The register is bit-addressable so that individual bits may be changed.

AZD-Area Word Zero Detector 48 is an AND circuit that detects when all 64 bits of the Area Word Register 46 are zero.

RS-Row Selector 50 is a one-out-of-eight selection circuit for 8 eight-bit busses. Each bus corresponds to one bit row within the subarray stored in the Area Word Register 46.

VSR-Video Shift Register 52 is an 8 bit shift register which serializes the data from the Row Selector so that it may supply video information to a raster device.

DARZ-Data Address Register Zero 54 is an AND circuit that detects when all 12 bits of the Data Address Register 38 are zero.

FAR-Free Address Register 56 is a 12 bit register used to address the free list stored in Tag Memory 42.

LFAR-Last Free Address Register 48 is a 12 bit register used in processing the free list tag stored in Tag Memory 42.

FARZ-Free Address Register Zero 60 is an AND circuit that detects when all 12 bits of the Free Address Register 56 are zero.

LDARZ-Last Data Address Register Zero 62 is an AND circuit that detects when all 12 bits of the Last Data Address Register 40 are zero.

XO-X Overflow 64 is a one bit register used to save the overflow condition of X High Register 22.

YO-Y Overflow 68 is one bit register used to detect the overflow from Y High Register 26.

In FIG. 3 a number of control signal lines are used and it is understood that these signal lines are driven by sequential logic (not shown). For the sake of clarity, the operation of this sequential logic is described in the next sections in step by step form. Signals derived from the graphics generator 2 are utilized to initiate the sequences described below.

Power On and Reset Conditions

1. All words in row map memory 32 are reset to zero.
2. All words in row tag pointer memory 36 are reset to zero.
3. All words in tag memory 42 are initialized to values as explained below. The result is that all the words in the Area Word Memory are linked into the free list.

Initialization of the Tag Memory

The contents of the tag memory are initialized in the following sequence. The contents of address zero is set to one, the contents of address one is set to two, the contents of address two is set to three . . . , the contents of 4094 is set to 4095, the contents of 4095 is set to zero. This initialization links all the words in tag memory into the free list. The steps that the sequential logic must go through in controlling the data flow paths in FIG. 2 in order to achieve this result are as follows. (Refer to FIG. 3)

1. Reset DAR, 38, and LDAR, 40 to zero.
2. Increment DAR, 38, by one.
3. Write the contents of DAR, 38, into TM, 42, using as address the contents of LDAR 40.
4. Skip to step 8 if the contents of DAR equals zero as detected in DARZ, 54.
5. Increment DAR, 38, by one.
6. Increment LDAR, 40, by one.
7. Skip to step 3.
8. Stop and signal the end of the tag memory initialization.

Controls for Adding/Deleting Points

The steps that the sequential logic must go through in controlling the data flow in FIG. 2 for adding and deleting of points from the refresh memory are as follows. (Refer to FIG. 3.)

1. X input data is gated into XLR, 20, and XHR, 22, as shown.
2. Clear LDAR, 40.
3. Y input data is gated into YLR, 24, and YHR, 26. (Randomly access the row map and the initial row printer tag for the subarray row in which the point X,Y lies.)
4. Access RMM, 32, using as address the contents of YHR 26 and load the data into RMSR, 34.
5. Access RTPM, 36, using as address the contents of YHR 26 and load the data into DAR, 38.
6. Clear XC, 28. (Sequentially search for the address of the subarray within the subarray row in which the point lies.)
7. Skip to step 15 if the contents of XC, 28, equals the contents of XHR, 22, as detected by EC, 30.
8. Skip to step 12 if bit 1 of RMSR, 34, is zero.
9. Skip to step 45 if the contents of DAR, 38, equals zero as detected by DARZ, 54 (this is an error condition).
10. Load LDAR, 40, with the contents of DAR, 38.
11. Access TM, 42, using the contents of LDAR, 40, as address and load the accessed word into DAR, 38.
12. Increment XC, 28, by one.
13. Shift RMSR, 34, by one.
14. Skip to step 7. (Start of the word accessing sequence.)
15. Skip to step 18 if bit one of RMSR, 34, is zero.
16. Skip to step 45 if the contents of DAR, 38, equals zero as detected by DARZ, 54 (this is an error condition).
17. Skip to step 30. (Delink a word from the free list and link it into the active list.)
18. Access TM, 42, at address zero and load the data into FAR, 56.
19. Skip to step 46 if the contents of FAR, 56, equals zero as detected by FARZ, 60.
20. Access TM, 42, using as address the contents of FAR, 56, and load the data into LFAR, 58.
21. Write the contents of LFAR, 58, into TM, 42, at address zero.
22. Write the contents of DAR, 38, into TM, 42, using as address the contents of FAR, 56.
23. Skip to step 26 if the contents of LDAR, 40, equals zero as detected by LDARZ, 62.
24. Write the contents of FAR, 56, into TM, 42, using as address the contents of LDAR, 40.
25. Skip to step 27.
26. Write the contents of FAR, 56, into RTPM, 36, using as address the contents of YHR, 26.
27. Load DAR, 38, with the contents of FAR, 56.
28. Access RMM, 32; store the data in RMSR, 34; set a one bit in RMSR at position determined by the contents of XHR, 22, and restore the contents of RMSR into RMM.
29. Clear AWR, 46, and skip to step 31.
30. Access AWM, 44, using as address the contents of DAR, 38. (Begin plot Sequence.)
31. Set or reset a bit in AWR, 46, using the addresses XLR, 20, and YLR, 24.
32. Write the contents of AWR, 46, into AWM, 44, using as address the contents of DAR, 38.
33. Skip to step 35 if the contents of AWR, 46, equals zero as detected by AZD, 48.
34. Stop and signal the end of the point plotting sequence. (Delink a word from the active list and link it into the free list.)
35. Access TM, 42, using as address the contents of DAR, 38, and store the data in FAR, 56.
36. Skip to step 39 if the contents of LDAR, 40, equals zero as detected by LDARZ, 62.

37. Write the contents of FAR, 56, into TM, 42, using as address the contents of LDAR, 40.

38. Skip to step 40.

39. Write the contents of FAR, 56, into RTPM, 36, using as address the contents of YHR, 26.

40. Access RMM, 32; store the data in RMSR, 34; reset a bit in RMSR at the position determined by the contents of XHR, 22, and restore the contents of RMSR into RMM.

41. Access TM, 42, using address zero and store the data in FAR, 56.

42. Write the contents of DAR, 38, into TM, 42, using address zero.

43. Write the contents of FAR, 56, into TM, 42, using as addrss the contents of DAR, 38.

44. Skip to step 34.

45. Stop and signal that there was a system error.

46. Stop and signal that there was a compression overflow.

Generating Video Data for One Raster Field

The following describes how the logic of FIG. 2 is controlled to supply the video data to a raster device. The steps are as follows:

1. Reset XHR, 22, and YLR, 24, and YHR, 26, and YO, 68.

2. Reset XO, 64.

3. Skip to step 17 if YO, 68, is one.

4. Access RMM, 32, using as address the contents of YHR, 26, and store the data in RMSR, 34.

5. Access RTPM, 36, using as address the contents of YHR, 26, and store the data in DAR, 38.

6. Skip to step 9 if RMSR bit 1, is one.

7. Reset AWR, 46.

8. Skip to step 11.

9. Access AWM, 44, using as address the contents of DAR, 38, and store the data in AWR, 46.

10. Access TM, 42, using as address the contents of DAR, and store the data in DAR.

11. Load VSR, 52, when the last bit of the previous word has been shifted out of the register in the generation of video data.

12. Increment XHR, 22, whose carry will set XO, 64.

13. Shift RMSR, 34.

14. Skip to step 6 if XO, 64, is zero.

15. Increment YLR, 24, whose carry will increment YHR, 26. YHR's carry will set YO, 68.

16. Skip to step 2.

17. Stop and signal the end of the field.

In summary, the invention provides a refresh memory in which the full image dot matrix to be displayed is divided into a plurality of subarrays as shown in FIG. 2. The invention further provides a means (as described in the section entitled "Controls for Adding/Deleting Points") for updating the image without having to rewrite the entire memory contents. In addition, the invention provides means (as described in the section entitled "Generating Video Data for One Raster Field") for converting information stored in the refresh memory system into a form that can be supplied to a raster device.

The means for dynamically updating the image comprises several steps. The first is determining whether the subarray in which the point lies to be plotted is active or not. This operation is described in steps 1-17 of the section entitled "Controls for Adding/Deleting Points." Specifically, the row tag pointer memory 36, the row map memory 32 and the tag memory 42 are used to unravel the linked list which determines the order that the data in the area word memory 44 is stored. When the list is unraveled, the results will be either that the point will be included in an active subarray or that the point will not be in a currently active subarray. In the latter case, control is provided as described in steps 18–30 of the section entitled "Controls for Adding/Deleting Points" for creation of an active subarray by delinking a word from the free list. This operation involves updating the information in the row tag pointer memory 36, the row map memory 32, and the tag memory 42. At this point an area word may be accessed from area word memory 44 and placed in the area word register 46. The control for this operation is provided in steps 31–34 of "Controls for Adding/Deleting Points" for adding or deleting a point. The contents of the area word register 46 is rewritten into the area word memory 44. The last step is to consider the situation in which the last point has been deleted from a currently active area word. In this case a control means is provided working in accordance with steps 35–44 to delink this word from the active list and relink the word into the free list. This operation involves updating the information in the row tag memory 36, the row map memory 32 and the tag memory 42.

The means for converting the data in the area word memory into raster data in row major form comprises a row tag pointer memory 36, row map memory 32, tag memory 42 and associated control circuits operating in accordance with steps 1–17 in the section entitled "Generating Video Data for One Raster Field." This process consists of unraveling the linked list which describes how the data is stored in the area word memory so that the data is accessed in row major raster format. The unraveling of the list utilizes the row tag pointer memory 36, row map memory 32 and tag memory 42. The conversion of the data into video signals comprises accessing data from the area word memory, placing the data in area word register 46 and selection of a row of the area word using row selector 50 and serializing that row into a bit sequence using video shift register 52.

While the invention has been particularly shown and described with reference to a preferred embodiment thereof, it will be understood by those skilled in the art that various changes in the form and details may be made therein without departing from the spirit and scope of the invention.

What is claimed is:

1. An apparatus for mapping compressed image information between a refresh buffer and an image display device by dividing the image into small subarrays such that only non-zero subarrays are represented in the refresh buffer, said apparatus comprising: an area word memory for storing subarray information, each word containing dot matrix segments of a pictorial image;

row bit maps means for storing first manifestations designating active each subarray in which points are plotted and second manifestations designating inactive each subarray in which no points are plotted, said active subarrays being stored in said area word memory;

a row tag pointer memory for storing pointers associated with each row of subarrays whose active subarray map is stored in said row bit map, each said pointer pointing to the first word location in said area word memory designating the first area word of a link list of chained area words corresponding to each active subarray in said designated row;

whereby said information stored in said area word memory can be updated to reflect changes in said image such that by updating said row bit map corresponding to changes in said area word list, subarrays can be entered or deleted from the map and the area word memory as their active/inactive status changes.

2. The method of refreshing a raster display of a full image dot matrix, comprising the steps of:

dividing said full image into subarrays;

maintaining a row bit map wherein each row of the map contains first bits which designate each subarray in a row which has at least one dot of a given value in it active by turning on said first bit in said row bit map and second bits which designate each subarray in a row which does not have at least one of a given value in it inactive;

storing each such active subarray in a refresh buffer;

maintaining said map of said subarrays so that said map correlates said subarrays to their relative position in said full image dot matrix; and dynamically updating the full image dot matrix by reallocating the contents of said refresh buffer and said bit map as the full image changes with respect to time;

whereby subarrays may be entered and deleted from said refresh buffer and corresponding changes made to said map as the active/inactive status of said subarrays changes due to changes in said full dot matrix image.

3. The apparatus according to claim 1 additionally comprising tag memory means for storing the address of the next area word in the linked list of area words for a subarray row.

4. The apparatus of claim 1 in which said memory means comprises random-access memory means.

* * * * *